United States Patent [19]

Dixon et al.

[11] Patent Number: 5,270,652

[45] Date of Patent: Dec. 14, 1993

[54] MR METHOD AND APPARATUS EMPLOYING MAGNETIZATION TRANSFER CONTRAST INDUCING FAT-SELECTIVE RF PULSE

[75] Inventors: William T. Dixon; Xiaole Hong, both of Atlanta, Ga.

[73] Assignee: North American Philips Corporation, New York, N.Y.

[21] Appl. No.: 886,265

[22] Filed: May 20, 1992

[51] Int. Cl.$^5$ .............................................. G01V 3/00
[52] U.S. Cl. .................................. 324/309; 128/653.1
[58] Field of Search ............... 324/300, 307, 309, 310, 324/311, 312, 313, 314, 318, 322; 128/653.2, 653.5, 653.1

[56] References Cited

U.S. PATENT DOCUMENTS 5,050,609  9/1991  Balaban et al. ................... 128/653.1

OTHER PUBLICATIONS

"Three Dimensional Gadolinium-Enhanced MR Imaging of the Breast: Pulse Sequence with Fat Suppression and Magnetization Transfer Contrast" Radiology 1991, No. 181.

"Incidential Magnetization Transfer Contrast in Standard Multislice Imaging" Magnetic Resonance Imaging, vol. 8, pp. 417-422, 1990.

"Pulsed Magnetization Transfer Contrast" Book of Abstracts, Soc. of Magnetic Resonance in Medicine, 9th Ann. Meeting, 1990, p. 352.

"Magnetization Transfer Contrast (MTC) and Tissue Water Proton Relaxation in Vivo" Magnetic Resonance in Medicine 10, 135-144 (1989).

*Primary Examiner*—Michael J. Tokar
*Attorney, Agent, or Firm*—Jack D. Slobod

[57] ABSTRACT

A magnetic resonance and apparatus in which an examination zone is exposed, preferably repeatedly, with a sequence in which the same RF pulse is both selective to fat, for acting in a fat suppression scheme within the sequence and is configured for inducing substantial magnetization transfer contrast. Design parameters are given for a 1-2-1 binomial RF pulse and a 1-2-1-1-2-1 double binomial RF pulse having a 0° net flip angle at the Larmor frequency of water protons and a nominal 180° net flip angle at the Larmor frequency of fat bound protons. The partial derivatives of the latter nominal flip angle with respect to chemical shift and with respect to RF amplitude are each zero. Each of these RF pulse designs is implemented by a pulse which is substantially rectangular in amplitude, but which has alternations of phase between 0° and 180° during its duration to form the sub-pulses. An illustrative imaging sequence incorporates this RF pulse for preparing the spin system n the examination zone prior to an at least partial tipping of longitudinal magnetization into the transverse plane by an RF excitation pulse.

20 Claims, 5 Drawing Sheets

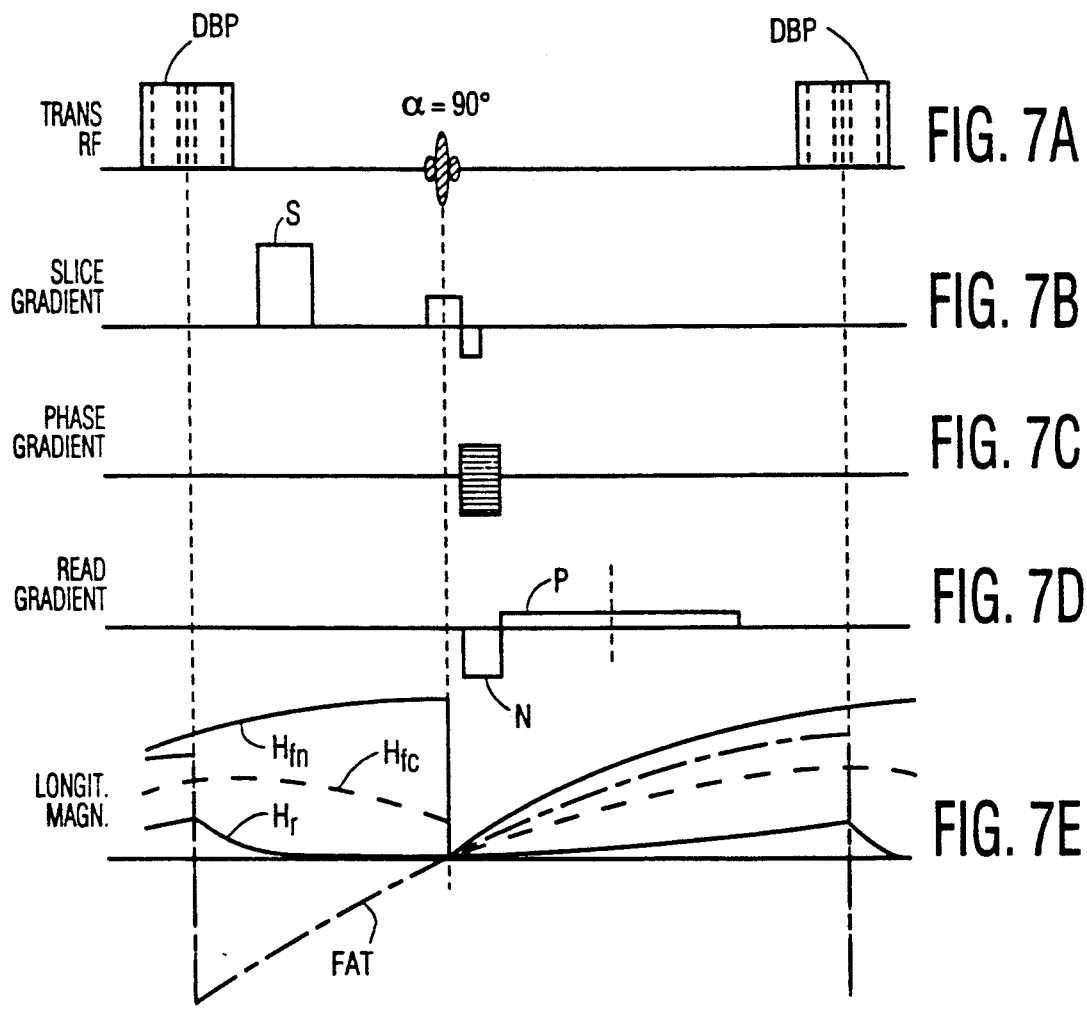

MR METHOD AND APPARATUS EMPLOYING MAGNETIZATION TRANSFER CONTRAST INDUCING FAT-SELECTIVE RF PULSE

BACKGROUND OF THE INVENTION

1. Field of the Invention

The invention relates to a magnetic resonance (MR) method utilizing both the Magnetization Transfer Contrast (MTC) effect and fat (or lipid) suppression.

2. Description of the Prior Art

A method of this kind is known from B. Pierce et al, "Three-dimensional Gadolinium-enhanced MR Imaging of the Breast: Pulse Sequence With Fat Suppression and Magnetization Transfer Contrast", Radiology 1991, No. 181, pp. 757-763. This method employs two RF pulses sequentially, the first, applied 2 KHz off the Larmor frequency of water protons to induce the MTC effect and the second applied at the Larmor frequency of fat bound protons and having a net zero flip angle for fat, but exciting transverse magnetization in water.

Magnetization Transfer Contrast offers the opportunity to produce new contrasts which may prove valuable in diagnosis or identification of tissue exhibiting pathology. It derives from magnetization exchange between proton spins in restricted motion $^1H_r$, which are not directly observed in the usual MRI experiments on account of an extremely short spin-spin relaxation time $T_2$, and the normally observed "free" water proton spins $^1H_f$. The short $T_2$ of the restricted motion protons $^1H_r$ implies a broad linewidth of the restricted motion proton pool. Destruction of the longitudinal magnetization of the $^1H_r$ immobile protons, i.e. saturation, by RF irradiation within (or near) the linewidth of the immobile protons and outside the linewidth of the free water protons, causes a decrease in the longitudinal magnetization of those free water protons $^1H_{fc}$ which are coupled to the immobile protons by the magnetization exchange pathway. The longitudinal magnetization of free water protons $^1H_{fn}$ which are not coupled to immobile protons is not influenced.

The resultant contrast between free water protons dependent upon their coupling to immobile protons was quantified in S. Wolff et al, "Magnetization Transfer Contrast (MTC) and Tissue Water Proton Relaxation in Vivo", Magn Res Med 1989, No. 10, pp. 135-144. Wolff et al assumed that irradiation at a frequency which was offset at least 5 kHZ and no more than 50 KHz from the Larmor frequency of water protons would be selective to the MTC effect. B. Hu et al (Book of Abstracts, Society of Magnetic Resonance in Medicine, 9th Annual Meeting, 1990, p. 352) reported utilizing a short intense 1-2-1 binomial pulse yielding 0° net flip angle for free water protons while saturating the immobile water protons. Also mentioned was that $H_r$ magnetization could be eliminated by a single pulse with a constant amplitude of 2500 radians/sec (approximately 400 Hz) for maximal rate of decay and played for 1 to 2 ms.

The use of a binomial pulse for fat suppression is also known for producing no net flip angle for water protons but the center-to-center spacing between spaced apart sub-pulses is chosen so that the binomial pulse is frequency selective to the Larmor frequency of fat and has a net flip angle at that frequency which s the sum of the flip angles of the sub-pulses. Fat-selective pulses of 90° or 180° net flip angle may be implemented depending upon the suppression scheme.

SUMMARY OF THE INVENTION

It is an object of the present invention to provide in and for an MR method and apparatus, an RF pulse whose energy is concentrated at relatively small frequency offsets from the Larmor frequency of water, which pulse is configured to induce the MTC effect, by saturating the immobile proton spins $^1H_r$, and is also optimized for selective inversion or excitation of fat. It is a further object that said RF pulse be configured to accomplish these MTC inducing and fat suppression purposes with the minimum RF energy.

Briefly, the foregoing and other objects are satisfied by providing a binomial RF pulse, such as 1-2-1, or a double binomial pulse, such as 1-2-1-1-2-1, composed of sub-pulses which are preferably contiguous and of the same amplitude (expressed as "RF pulse frequency"), alternate between 0° and 180° phase and have durations that vary, relative to that of the initial unit sub-pulse, according to the stated series of coefficients. The holding of RF pulse frequency constant over the entire RF pulse, although phase is alternated from sub-pulse to sub-pulse, minimizes the RF energy irradiating the patient and appears to maximize the saturation effect on the immobile $^1H_r$ protons. The amplitude and duration of a unit sub-pulse are chosen to place the resultant longitudinal magnetization at a local extremum of a two-dimensional surface determined for the pulse type used indicating the longitudinal magnetization produced as a function of chemical shift and flip angle of the unit sub-pulse. Because at the extremum the partial derivatives of the longitudinal magnetization with respect to chemical shift and sub-pulse flip angle are zero, this provides, to a first order, immunities to variation of the Larmor frequency of fat, due to local magnetic field inhomogeneity and susceptibility effects, and to variation of flip angle due to local variations in RF field strength produced by the RF coil.

Other objects, features and advantages of the present invention will become apparent upon review of the following detailed description of the preferred embodiments in conjunction with the appended drawing, wherein:

BRIEF DESCRIPTION OF THE DRAWING

FIGS. 7A-7E are aligned graphs versus time respectively of transmitted RF, slice gradient, phase encoding gradient, read gradient, and resultant longitudinal magnetizations of relevant proton spin populations for an illustrative gradient echo pulse sequence utilizing the RF pulse of either FIGS. 3 or 4.

DETAILED DESCRIPTION OF THE PREFERRED EMBODIMENTS

Figure 1:
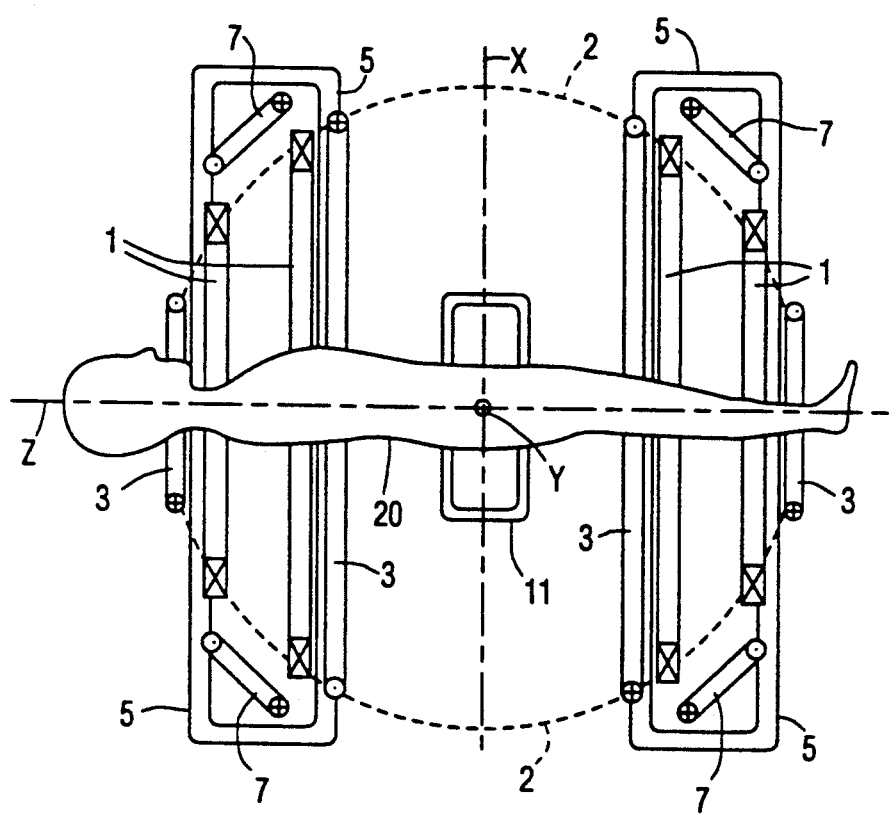
FIG. 1 diagrammatically illustrates the coils and patient receiving space of a magnetic resonance tomography apparatus which is suitable for carrying out the method in accordance with the invention.

The MRI apparatus which is diagrammatically shown in FIG. 1 comprises a system consisting of four coils 1 for generating a uniform, steady magnetic field which may have a strength of from some tenths of Tesla (T) to a few T. This field extends in the z-direction of a cartesian coordinate system. The coils are concentrically arranged with respect to the z-axis and may be situated on a spherical surface 2. The patient 20 to be examined is arranged within these coils.

In order to generate a magnetic field Gz which extends in the z direction and which linearly varies in this direction there are provided four coils 3 which are preferably situated on the same spherical surface. There are also provided four coils 7 which generate a magnetic gradient field Gx (i.e. a magnetic field whose strength varies linearly in one direction) which also extends in the z-direction but whose gradient, extends in the x-direction. A magnetic gradient field Gy which extends in the z-direction with a gradient in the y-direction is generated by four coils 5 which may have the same shape as the coils 7 but which are arranged in a position rotated through 90° with respect thereto. Only two of these four coils are visible in FIG. 1.

Because each of the three coil systems 3, 5 and 7 for generating the magnetic gradient fields Gz, Gy and Gx is symmetrically arranged with respect to the spherical surface 2, the field strength in the center of the sphere, being at the same time the origin of said cartesian xyz coordinate system, is determined only by the steady, uniform magnetic field of the coil system 1. Furthermore, an RF coil 11 is symmetrically arranged with respect to the plane z=0 of the coordinate system, which RF coil is constructed so that it generates an essentially uniform RF magnetic field which extends in the x direction, i.e. perpendicularly to the direction of the steady, uniform magnetic field. The RF coil receives an RF modulated current from an RF generator 4 during each RF pulse. Subsequent to a sequence, the RF coil 11, or a separate RF receiver coil, serves for the reception of the nuclear resonance signals generated in the examination zone.

Figure 2:
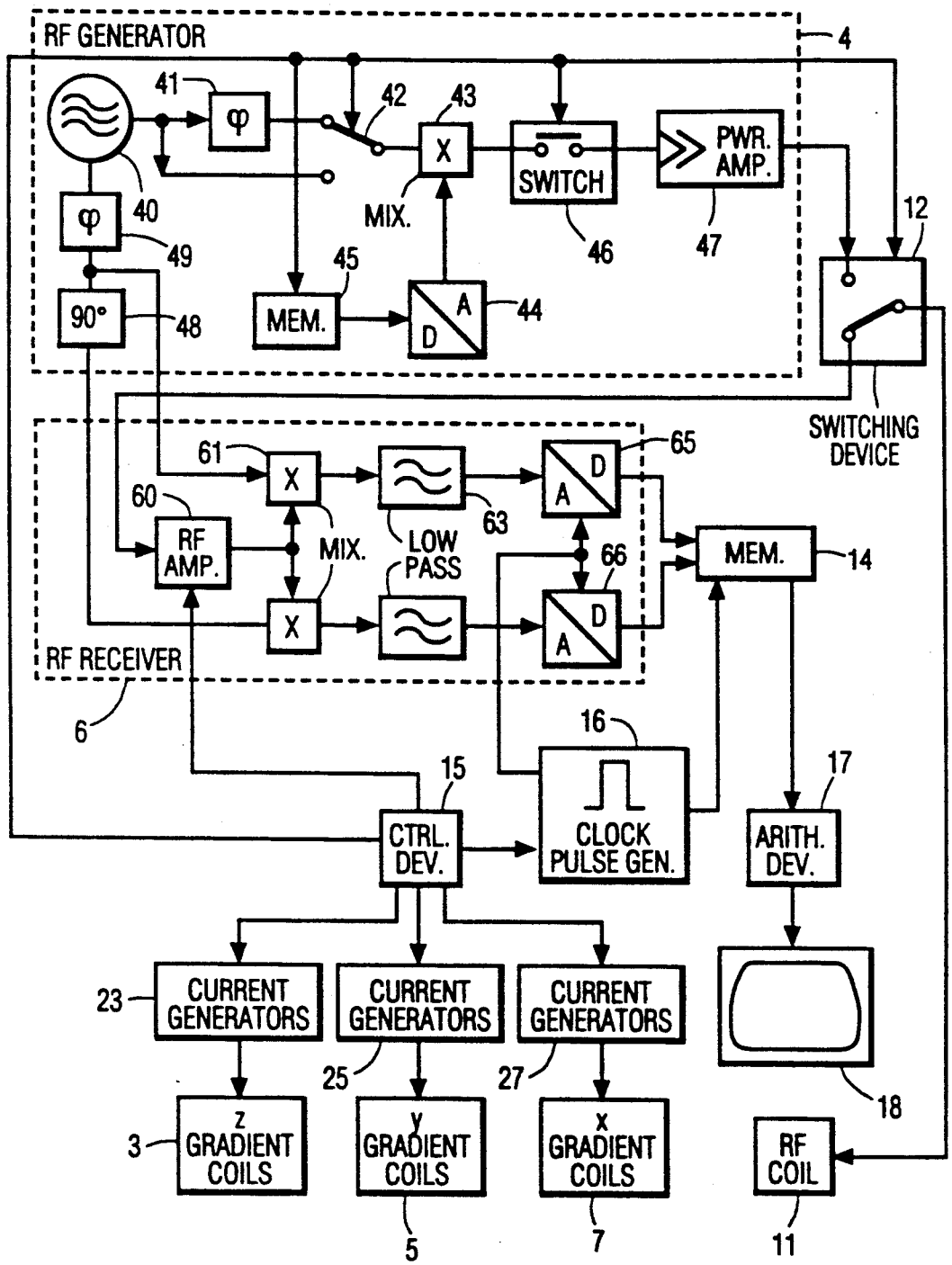
FIG. 2 is a block diagram of such an apparatus.

FIG. 2 shows a simplified block diagram of this MRI apparatus. Via a switching device 12, the RF coil 11 is connected on the one side to an RF generator 4 and on the other side to an RF receiver 6.

The RF generator 4 comprises an RF oscillator 40 whose frequency can be digitally controlled by means of a control unit 15 and which supplies oscillations of a frequency corresponding to the Larmor frequency of the nuclei to be excited at the field strength generated by the coils 1. As is known, the Larmor frequency f is calculated in accordance with the relation $f = cB$, where B is the magnetic induction in the steady, uniform magnetic field and c is the gyromagnetic ratio which, for example for protons amounts to 42.56 MHz/T. The output of the oscillator 40 is connected to an input of a mixing stage 43. The mixing stage receives a second input signal from a digital-to-analog converter 44 whose output is connected to a digital memory 45. Under the control of the control device, a series of digital data words representing an envelope signal is read from the memory.

The mixing stage 43 processes the input signals applied thereto so that a carrier oscillation modulated by the envelope signal appears on its output. The output signal of the mixing stage 43 is applied, via switch 46 which is controlled by the control device 15, to an RF power amplifier 47 whose output is connected to the switching device 12. This device is also controlled by the control device 15.

The receiver 6 comprises an RF amplifier 60 which is connected to the switching device and which receives the nuclear resonance signals generated in the RF coil 11; for this purpose the switching device must occupy the corresponding position. The amplifier 60 comprises a muting input which is controlled by the control device 15 and via which it can be blocked so that the gain is substantially zero. The output of the amplifier is connected to the first inputs of two multiplying mixing stages 61 and 62 which supply a respective output signal which corresponds to the respective product of their input signals. The second inputs of the mixing stages 61 and 62 receive a signal having the frequency of the oscillator 40, a phase shift of 90° existing between the signals on the two inputs. This phase shift is produced by means of a 90° phase shifter 48 whose output is connected to the input of the mixing stage 62 and whose input is connected to the input of the mixing stage 61 and to the output of the oscillator 40.

The output signals of the mixing stages 61 and 62 are applied to a respective analog-to-digital converter 65, 66, via low-pass filters 63 and 64 which suppress the frequency supplied by the oscillator 40 as well as all higher frequencies and which conduct low-frequency components. These converters convert the analog signals of the circuit 61 . . . 64, forming a quadrature demodulator, into digital converters 65 and 66 and the memory 14 receive their clock pulses from a clock pulse generator 16 which can be inhibited and enabled by the control device 15, via a control line, so that the signals supplied by the RF coil 11 and transposed to the low-frequency range can be converted into a series of digital data words for storage in the memory 14 only during a measuring interval defined by the control device 15.

The three coil systems 3, 5 and 7 are powered by current generators 23, 25 and 27 with a current whose variation in time can be controlled by the control unit 15.

The data words stored in the memory 14 are applied to an arithmetic device 17 which determines, therefrom using a discrete Fourier transformation, the spectrum of the nuclear magnetization for supply to a suitable display unit, for example a monitor 18.

Figure 3:
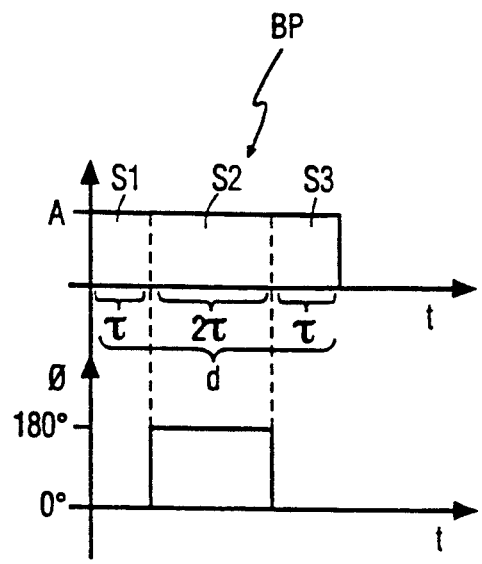
FIG. 3 shows the amplitude and phase of a 1-2-1 binomial pulse over time in accordance with one embodiment of the invention.

FIG. 3 illustrates a so-called 1-2-1 binomial RF pulse BP at the Larmor frequency of water protons, which for the purpose of producing the desired MTC and fat-selective effects with a minimum deposition of RF energy into the patient is chosen to have a constant amplitude envelope A (conveniently expressed in units of frequency) over its three sub-pulses S1, S2, S3. Pulse BP produces a 0° degree flip angle at the Larmor frequency of water and preferably a flip angle of substantially 180° at the Larmor frequency of fat bound protons. Sub-pulses S1 and S3 are at 0° phase in order to have a positive flip angle and sub pulse S2 is at 180° phase in order to have a negative flip angle. Since the absolute value of the flip angle of each rectangular sub-pulse is the product of its amplitude and duration, sub-pulses S1 and S3 are of duration $\tau$ and sub-pulse S2 is of duration $2\tau$. In view of the very short T2 of the immobile protons $H_r$, the extent to which saturation thereof is produced is similar to that which would be produced by an RF pulse of constant amplitude A and overall duration $d=4\tau$ of pulse BP.

Figure 4:
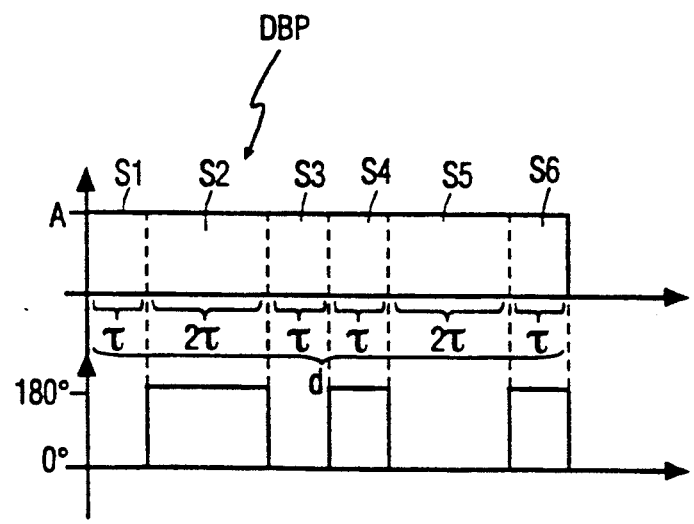
FIG. 4 shows the amplitude and phase of a 1-2-1-1-2-1 double binomial pulse over time in accordance with another embodiment of the invention.

FIG. 4 illustrates a so-called 1-2-1-1-2-1 double binomial RF pulse DBP, also at the Larmor frequency of water protons, for also producing a net flip angle of 0° at this frequency and preferably a net flip angle of 180° at the Larmor frequency of fat. Sub-pulses S1, S3, S5 are at 0° phase for producing positive flip angles and sub-pulses S2, S4, and S6 are at 180° phase for producing negative flip angles. In view of the constant amplitude A extending over the contiguous sub-pulses S1-S6, sub-pulses S2 and S5 each have a duration of $2\tau$, which is twice the duration, $\tau$, of each of sub-pulses S1, S3, S4 and S6. The saturation effect of pulse DBP is also similar to that produced by an RF pulse of constant amplitude A and the overall duration $d=8\tau$ of pulse DBP.

Not only are the amplitude A and duration $\tau$ of a unit sub-pulse for each of pulses BP and DBP chosen preferably to produce a net flip angle of 180° at the Larmor frequency of fat, but also the choices are made in a manner to provide the best immunity to local variation within the patient of the Larmor frequency of fat, caused by magnetic inhomogeneity and susceptibility effects, and to local variation in penetration of RF energy from coil 11. The latter local variation in penetration causes a local variation in the flip angle produced by a unit sub-pulse. These immunities are achieved by selecting the amplitude and duration so that the Larmor frequency of fat falls at a flat extremum, namely a maximum, of the surface of FIG. 5 for 1-2-1 binomial pulse BP and of FIG. 6 for 1-2-1-1-2-1 double binomial pulse DBP. At the extremum, the partial derivatives of the longitudinal magnetization with respect to chemical shift and with respect to the flip angle of a unit sub-pulse are each zero.

Figure 5:
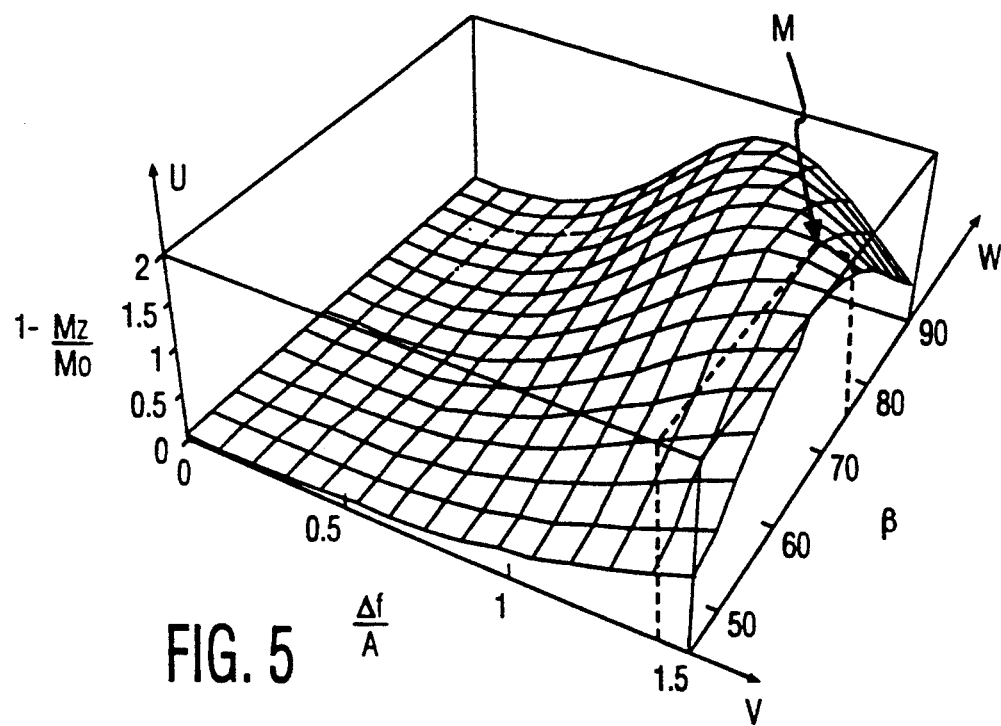
FIG. 5 is a design surface for optimizing the 1-2-1 binomial pulse of FIG. 3.
Figure 6:
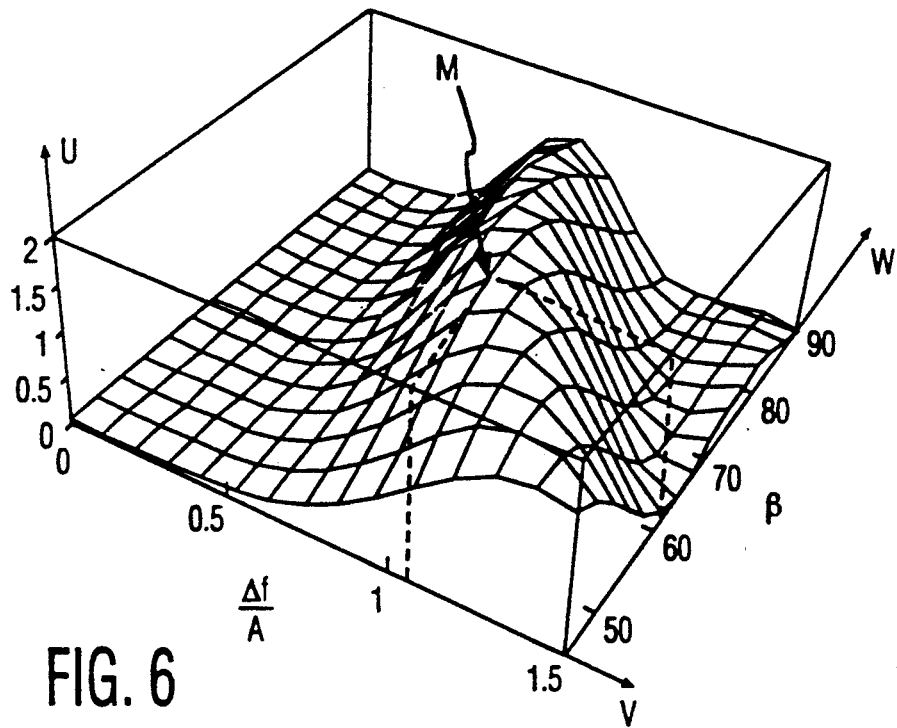
FIG. 6 is a design surface for optimizing the 1-2-1-1-2-1 double binominal pulse of FIG. 4.

The surfaces depicted in FIGS. 5 and 6 were derived by solution of the Bloch equations under the assumption of no relaxation. In each figure, the axes are similarly labelled. The U axis represents $1-Mz/M0$, where M0 is the longitudinal magnetization preceding the RF pulse BP or DBP and Mz is the longitudinal magnetization just after this RF pulse. Thus, a value on the U axis of 0 corresponds to no net effect on the longitudinal magnetization, i.e. a net flip angle of 0°, and a value of 2 corresponds to a complete inversion of the longitudinal magnetization, i.e. a net flip angle of 180°. The V axis represents $\Delta f/A$, where $\Delta f$ is the frequency offset or absolute chemical shift of fat bound protons and A continues to represent the constant amplitude, in Hz, of the RF pulse. The W axis represents the flip angle $\beta$ of a unit sub-pulse, where $\beta = 360° \times A\tau$.

Referring first to FIG. 5, it is seen that the maximum M, yielding a value of $U=2$, occurs at about $V=1.4$ and $W=70°$. Thus, because $\Delta f$ for fat is about 75 Hz at 0.5 T and about 225 Hz at 1.5 T, the following table sets forth the calculations of the parameters for the 1-2-1 pulse:

0.5 T $A = 75$ Hz/1.4 = 53.6 Hz
$\tau = 70°/360° \times 1/53.6$ Hz $\times 1,000$ ms/s = 3.63 ms
$d = 4\tau = 14.52$ ms 1.5 T $A = 225$ Hz/1.4 = 160.7 Hz
$\tau = 70°/360° \times 1/160.7$ Hz $\times 1,000$ ms/s = 1.21 ms
$d = 4\tau = 4.84$ ms Similarly, with reference to FIG. 6, it is seen that the maximum M, yielding a value of $U=2$, occurs at about $V=1.07$ and $W=64°$. Based thereon, the following table sets forth the calculations of parameters for the 1-2-1-1-2-1 pulse:

0.5 T $A = 75$ Hz/1.07 = 70.1 Hz
$\tau = 64°/360° \times 1/70.1$ Hz $\times 1,000$ ms/s = 2.54 ms
$d = 8\tau = 20.32$ ms 1.5 T $A = 225$ Hz/1.07 = 210.3 Hz
$\tau = 64°/360° \times 1/210.3$ Hz $\times 1,000$ ms/s = 0.845 ms
$d = 8\tau = 6.76$ ms The 1-2-1 binomial pulse BP and 1-2-1-1-2-1 double pulse DBP, for 0.5 T and 1.5 T, each have a combination of amplitude A and overall duration d sufficient to induce a strong noticeable MTC effect.

FIG. 7, shows an illustrative gradient echo sequence utilizing the RF preparation pulse DBP. It should be understood that the pulse BP could be substituted for pulse DBP and further that other conventional imaging or localized spectroscopy sequences could be substituted for the illustrated gradient echo sequence. Other imaging sequences in which RF pulse BP or DBP could be incorporated for inducing the MTC effect and suppressing spin resonance signals from fat include spin echo, "turbo spin echo" (a trademark of Philips Medical Systems) and echo planar.

In the illustrated sequence, as shown on line E, the RF pre-pulse DBP (line A) causes inversion of the longitudinal magnetization of fat while also destroying the longitudinal magnetization of immobile protons $H_r$. Through the process of magnetic exchange, the longitudinal magnetization of free water protons $H_{fc}$ which are coupled to the immobile protons $H_r$ is caused to decay. Free water protons $H_{fn}$ not coupled to immobile protons are not affected by pre-pulse DBP. Thereafter, a spoiling gradient S (line B) is applied in the slice direction to dephase any transverse magnetization. The slice-selective excitation or read RF pulse $\alpha$ (line A) is centered at the time when the longitudinal magnetization of fat (line E) passes through zero, resulting in the suppression of spin resonance signals from fat. Excitation pulse $\alpha$ rotates some ($\alpha < 90°$) or all ($\alpha = 90°$) of the then existing longitudinal magnetization, i.e. primarily due to $H_{fn}$, to the transverse direction. A spin warp of the resulting transverse magnetization is produced in the phase encoding direction by the phase gradient (line C), which has a different integral each partial experiment of the sequence, and the read gradient (line C) having the short, strong negative polarity portion N followed by the long, weak positive polarity portion P, having an integral over time which is twice the absolute value of the integral of portion N, causes an RF echo signal (not shown) to be produced during portion P.

It should now be appreciated that the objects of the present invention have been satisfied. Numerous modifications are possible in the details given within the intended spirit and scope of the invention. For example, an operating point on either of the surfaces of FIGS. 5 and 6 could be used with $M=0$, corresponding to a net flip angle of 90° at the Larmor frequency of fat. The resultant transverse magnetization due to fat bound protons would be dephased out of coherence by spoiler gradient S, resulting in suppression of spin resonance signals due to fat. However, because such operating point is not at a maximum or minimum of the surface, an optimal immunity to local variations in chemical shift of fat and penetration of RF energy would not result.

Further, it may be preferable for certain studies the read pulse x occurs slightly prior to the zero crossing of the longitudinal magnetization of fat, e.g. where the longitudinal magnetization of fat is negative and a small portion of its value, for example, 10%.

What is claimed is:

1. In a magnetic resonance method where an RF MTC pulse acts upon proton spins distributed in an object in the presence of a substantially uniform, steady longitudinal magnetic field and is configured for producing a flip angle of nominally 0° at the Larmor frequency of water protons while being effective at frequencies offset from the Larmor frequency of water protons for substantially saturating immobile proton spins and thereby inducing magnetization transfer contrast in the longitudinal magnetization of water proton spins, followed by an RF excitation pulse for producing transverse magnetization from the longitudinal magnetization of said spins, the improvement comprising that said RF MTC pulse is adjusted to produce a predetermined flip angle of nominally at least 90° at the Larmor frequency of fat bound proton spins.

2. The method as claimed in claim 1, wherein said predetermined flip angle is nominally 180° and wherein the predetermined flip angle produced has first order immunity to local variation within said object in amplitude of said steady magnetic field and in amplitude of said RF MTC pulse.

3. The method as claimed in claim 2, wherein said RF MTC pulse has a substantially constant amplitude over its duration and a phase which is alternated between 0° and 180°.

4. The method as claimed in claim 3, wherein the phase of the RF MTC pulse is alternated in a manner such that said RF MTC pulse comprises a double binomial sequence of sub-pulses.

5. The method as claimed in claim 4, wherein said double binomial sequence is 1-2-1-1-2-1.

6. The method as claimed in claim 3, wherein the phase of the RF MTC pulse is alternated in a manner that said RF MTC pulse comprises a binomial sequence of sub-pulses.

7. The method as claimed in claim 1, wherein said RF MTC pulse has a substantially constant amplitude over its duration and a phase which is alternated between 0° and 180°.

8. The method as claimed in claim 7, wherein the phase of the RF MTC pulse is alternated in a manner such that said RF MTC pulse comprises a double binomial sequence of sub-pulses.

9. The method as claimed in claim 8, wherein said double binomial sequence is 1-2-1-1-2-1.

10. The method as claimed in claim 7, wherein the phase of the RF MTC pulse is alternated in a manner that said RF MTC pulse comprises a binomial sequence of sub-pulses.

11. The method as claimed in claim 2, wherein said RF MTC pulse comprises a double binomial sequence of sub-pulses.

12. The method as claimed in claim 11, wherein said double binomial sequence is 1-2-1-1-2-1.

13. The method as claimed in claim 2, wherein said RF MTC pulse comprises a double binomial sequence of sub-pulses.

14. The method as claimed in claim 1, wherein said RF MTC pulse comprises a double binomial sequence of sub-pulses.

15. The method as claimed in claim 14, wherein said double binomial sequence is 1-2-1-1-2-1.

16. The method as claimed in claim 1, wherein said RF MTC pulse comprises a double binomial sequence of sub-pulses.

17. In a magnetic resonance apparatus comprising means for producing a substantially uniform, steady longitudinal magnetic field in an examination zone; means for forming and transmitting an RF MTC pulse into the examination zone which is configured for producing a flip angle of nominally 0° at the Larmor frequency of water protons while being effective at frequencies offset from the Larmor frequency of water protons for substantially saturating immobile proton spins and thereby inducing magnetization transfer contrast in the longitudinal magnetization of water proton spins, followed by an RF excitation pulse for producing transverse magnetization from the longitudinal magnetization of said spins, wherein said RF MTC pulse is adjusted to produce a predetermined flip angle of nominally at least 90° at the Larmor frequency of fat bound proton spins.

18. The apparatus as claimed in claim 17, wherein said predetermined flip angle is nominally 180° and wherein the predetermined flip angle produced has first order immunity to local variation within said object in amplitude of said steady magnetic field and in amplitude of said RF MTC pulse.

19. The apparatus as claimed in claim 18, wherein said RF MTC pulse has a substantially constant amplitude over its duration and a phase which is alternated between 0° and 180°.

20. The apparatus as claimed in claim 19, wherein the phase of the RF MTC pulse is alternated in a manner such that said RF MTC pulse comprises a double binomial sequence of sub-pulses.

* * * * *